United States Patent [19]

Baumeister et al.

[11] Patent Number: 4,783,373
[45] Date of Patent: Nov. 8, 1988

[54] ARTICLE WITH THIN FILM COATING HAVING AN ENHANCED EMISSIVITY AND REDUCED ABSORPTION OF RADIANT ENERGY

[75] Inventors: Philip W. Baumeister, Loomis; Matthew E. Krisl, Santa Rose, both of Calif.

[73] Assignee: Optical Coating Laboratory, Inc., Santa Rosa, Calif.

[21] Appl. No.: 853,567

[22] Filed: Apr. 18, 1986

[51] Int. Cl.⁴ .................. B32B 9/04; B32B 17/06; G02B 5/22; H01L 31/00
[52] U.S. Cl. .................................. 428/446; 425/428; 425/432; 425/696; 425/697; 425/701; 425/702; 350/1.6; 136/256
[58] Field of Search ............... 428/426, 428, 432, 433, 428/446, 689, 696, 697, 699, 701, 702; 350/1.1, 1.6; 136/256, 257

[56] References Cited

U.S. PATENT DOCUMENTS

| | | | |
|---|---|---|---|
| 4,293,732 | 10/1981 | Rancourt et al. | 136/256 |
| 4,372,987 | 2/1983 | Ganner et al. | 427/166 |
| 4,578,527 | 3/1986 | Rancourt et al. | 350/1.6 |
| 4,599,272 | 7/1986 | Ichikawa | 428/428 |

Primary Examiner—John E. Kittle
Assistant Examiner—Susan S. Rucker
Attorney, Agent, or Firm—Flehr, Hohbach, Test, Albritton & Herbert

[57] ABSTRACT

A coating useful for a solar cell is formed by concurrent deposition of two materials, such as silicon dioxide and magnesium fluoride, on a substrate within a single vacuum chamber. The deposition is monitored to enable control of the ratio of the materials and the thickness of the coating. An alternative embodiment of a coating employs alternating layers of different materials which form pairs or periods, each having a very small optical thickness. By virtue of the coatings, emissivity is enhanced by suppression of the reststrahlen reflectance and solar absorption is reduced by external reflection of the ultraviolet portion of the solar spectrum.

22 Claims, 2 Drawing Sheets

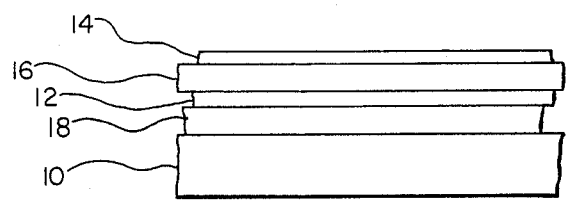
FIG.—1
PRIOR ART
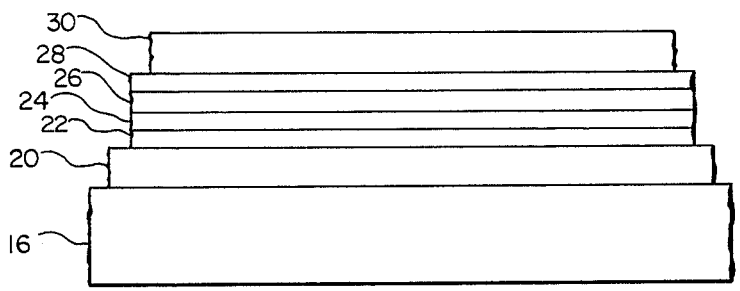
FIG.—2
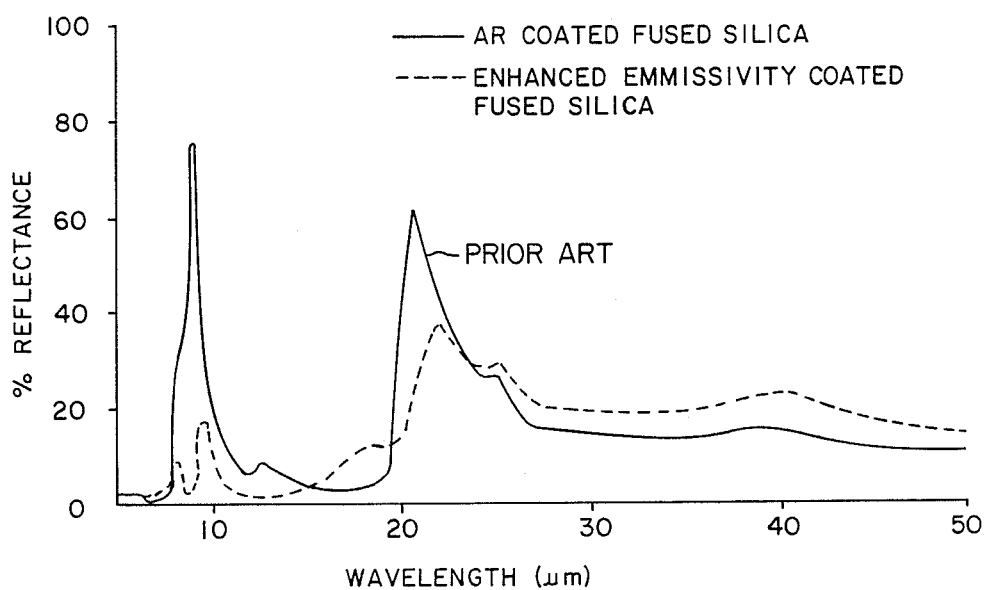
FIG.—3

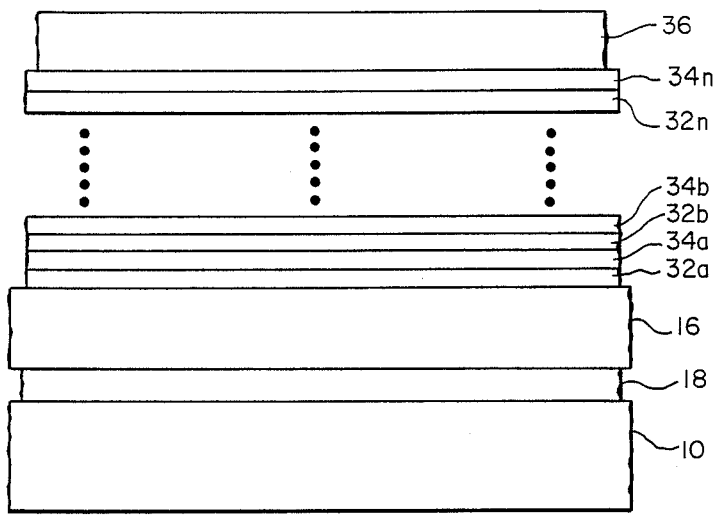
FIG. —4
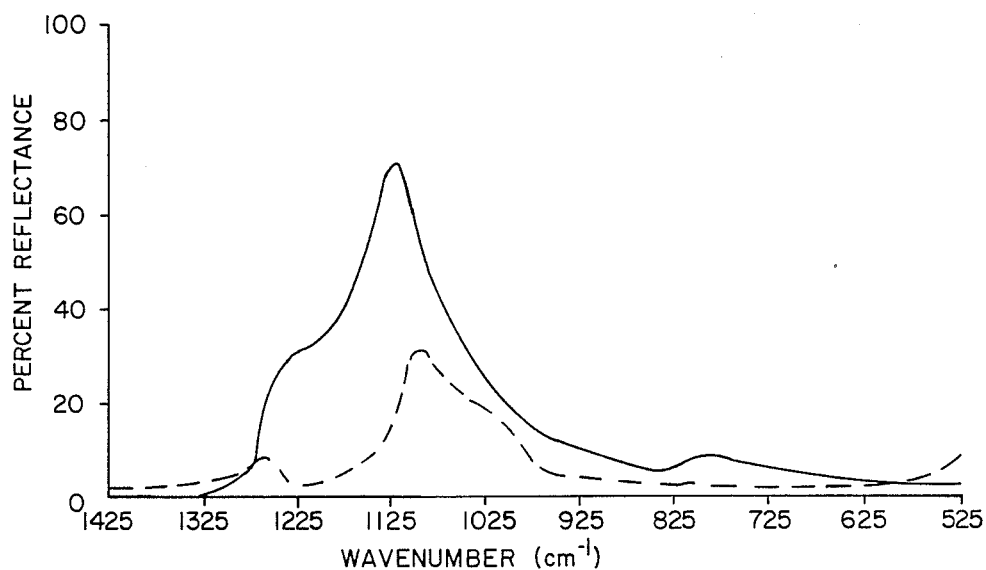
FIG. —5

ARTICLE WITH THIN FILM COATING HAVING AN ENHANCED EMISSIVITY AND REDUCED ABSORPTION OF RADIANT ENERGY

TECHNICAL FIELD

This invention relates to an assembly useful with solar arrays and in particular to a thin film coating that provides an enhanced emissivity and lowered absorption for a solar cell cover.

BACKGROUND OF THE INVENTION

When utilizing solar arrays to obtain power from solar radiation, it is desirable to provide optimum conversion efficiency and to minimize deleterious thermal and optical effects. These objectives are particularly significant when solar arrays are incorporated in satellites or spacecraft. One approach to increasing efficiency is to lower operating temperatures of conventional solar arrays. This temperature reduction is achieved by decreasing the unusable solar energy that is absorbed, or by increasing the emissivity which is directly proportional to the energy that is reradiated into space. It has been shown that a power gain of 1% can be realized with a 0.02 decrease in solar absorption of an array, or by an 0.04 increase in front side emissivity of a two-sided array, or by an 0.02 increase in emissivity for a one-sided body mounted array.

Emissivity is enhanced by suppression of the coverglass reststrahlen reflectance and solar absorption is reduced by external reflection of the ultraviolet portion of the solar spectrum.

In prior art apparatus, solar cell coverglasses and thin film coatings have been provided to increase emissivity and to decrease solar absorption of the solar cell assembly. Such coverglasses are made from materials, such as fused silica or specialty glasses like Corning 0211 microsheet and Pilkington ceria doped glass. In conventional solar cell assemblies, thin film coatings are generally applied to the internal and external surfaces of the coverglass. The external coatings are usually formed as a single layer magnesium fluoride anti-reflection (AR) layer; whereas the internal coatings are ultraviolet reflecting coatings (UVR) which protect the adhesive, that is used for holding the coating to the substrate, from ultraviolet light exposure. Otherwise the ultraviolet rays would cause darkening of the adhesive thereby resulting in a reduction of energy transmission. Coverglasses produced with ceria doped glass do not normally require the internal UVR coatings to prevent darkening since they are opaque to ultraviolet radiation.

SUMMARY OF THE INVENTION

An object of this invention is to provide a coverglass thin film coating with enhanced emissivity and reduced solar absorption.

Another object of this invention is to provide a coverglass thin film coating that allows operation of a solar array at reduced temperatures, and with an increase in power gain.

In accordance with this invention, a thin film coating that is useful for incorporation in a solar cell assembly is formed by deposition in thin films of a plurality of materials on a substrate or coverglass of the assembly. In an implementation of this invention, alternating layers of different coating materials are deposited within a common vacuum chamber under controlled conditions, in order to achieve both enhanced emissivity and reduced absorption. In a preferred implementation, a plurality of alternating layers of different coating materials which enhance emissivity are formed by simultaneous deposition of the materials onto a substrate. Control apparatus determines the volume ratio of the materials and also the thicknesses of the different thin film layers.

BRIEF DESCRIPTION OF THE DRAWINGS

The invention will be described in detail with reference to the drawings in which:

FIG. 1 is a sectional view, partly broken away, of a prior art solar cell cover configuration;

FIG. 2 is a sectional view of a coverglass assembly, including an integral thin film layer having a mixture of two materials for achieving enhanced emissivity;

FIG. 3 is a plot of percentage of infrared reflectance versus wavelength indicating the enhanced emissivity for a coated fused silica subtrate;

FIG. 4 is a sectional view of a coverglass assembly, illustrating a multi-layer coating with alternating layers of different materials, in an alternative implementation of this invention; and FIG. 5 is a plot of the percentage of reflectance plotted against wavelength applicable to the assembly and coating of FIG. 4.

Similar numerals refer to similar elements throughout the drawings.

DESCRIPTION OF THE PREFERRED EMBODIMENT

With reference to FIG. 1, a prior art solar cell assembly is fabricated with an anti-reflection (AR) coated solar cell 10. An internal thin film coating 12 and an external thin film coating 14 encompass a coverglass 16 and are joined to the solar cell by means of an adhesive 18. The external coating 14 is formed as a single magnesium fluoride anti-reflection (AR) layer, whereas the internal coating 12 is formed as an ultraviolet reflecting (UVR) coating that protects the adhesive from ultraviolet light exposure, which would otherwise cause darkening of the adhesive. Ceria doped glass substrates may not need an internal coating since they absorb ultraviolet radiation.

The coverglass or substrate 16 is known to have an undesirable reflection peak, generally at a wavelength in the approximate range of 9 to 11 micrometers. Such reflection peaks tend to inhibit the ability of the substrate to radiate energy, and reduces the emissivity of the substrate. This phenomenon occurs at the reststrahlen bands of the substrate, and an objective in this technology of optical coatings is to reduce the reflectance that occurs at the reststrahlen peaks of the substrate and thereby enhance emissivity.

In accordance with this invention, a solar cell cover assembly includes a coating 20 that is deposited on the coverglass or substrate 16, as illustrated in FIG. 2. The substrate preferably is made of fused silica, by way of example, but Pilkington CMX ceria doped glass or Corning 0211 microsheet may also be used. The coating 20 serves to enhance emissivity of the solar cell cover structure. The coating 20 is deposited on a surface of the coverglass, preferably by simultaneous evaporation of two materials within a common vacuum chamber at a nominal base vacuum pressure of $5 \times 10^{-6}$ Torr. The materials, which may be magnesium fluoride and silicon dioxide for example, are disposed in separate sources within the vacuum chamber and heated by resistance heating or electron gun bombardment. The evaporation rate of each source is independently controlled by means of crystal rate monitoring apparatus so that a predetermined volume ratio of the materials and total coating thickness is established in the coating 20. Prior to deposition, the coverglass substrate is heated to nominally 250° C. Deposition time for the co-evaporated layer is about 30 minutes.

In one implementation, the co-evaporated coating is formed with about 60% silicon dioxide and 40% magnesium fluoride. The coating composition provides stress compensation and minimizes warpage of the structure, as well as enhancing emissivity. In this embodiment, the physical thickness of the coating is approximately 1.5 to 2.0 micrometers which corresponds to one-quarter wave optical thickness at the wavelength of the major reststrahlen peak. The layer of co-evaporated material is nearly opaque in the spectral region near a wavelength of 10 $\mu$m, thereby greatly reducing the reststrahlen peak of the fused silica substrate and thus increasing the emissivity in the same spectral region. Emissivity is increased by six to seven percent relative to uncoated fused silica. Since both $MgF_2$ and $SiO_2$ are transparent across the solar spectrum and the effective index of refraction of the blended layer is less than that of the substrate, transmission of the solar flux is greater than or equal to bare fused silica at all wavelengths within the solar spectrum.

When beneficial, ultraviolet reflection (UVR) may be achieved by a group of thin film layers formed over the single layer coating 20. As shown in FIG. 2 a first thin film 22 of tantalum pentoxide is deposited over the coating 20 and a thin film 24 of silicon dioxide is next deposited over the tantalum pentoxide film 22. A second similar pair or period of tantalum pentoxide and silicon dioxide thin film layers 26 and 28 respectively are then deposited so that a series of four thin film layers of alternating materials is formed. Although four thin film layers are shown for this embodiment, it should be understood that multiple groupings, such as eight layers, may be used to serve as an ultraviolet reflector unit. The quarterwave optical thickness of each layer in this grouping of thin films of tantalum pentoxide and silicon dioxide is preferably about 0.3 micrometers, by way of example. To complete the structure an anti-reflectance (AR) layer 30 of magnesium fluoride is provided on top of the ultraviolet reflector unit. This AR layer is approximately 0.6 micrometers in quarterwave optical thickness. By virtue of this coating design, both ultraviolet reflection and enhanced emissivity are achieved. However, if more than two periods of tantalum pentoxide and silicon dioxide are utilized, emissivity enhancement will not be optimized.

FIG. 3 illustrates the suppression of reflectance, particularly in the 10 micrometer wavelength region of interest, when using the novel assembly of the embodiment of this invention, as illustrated in FIG. 2. The solid curve depicts the percentage reflectance over a given range of wavelengths for a fused silica substrate coated with magnesium fluoride in a single material layer, as practiced in the prior art. It is noted that significant peaks appear at about 10 microns and at approximately 20 microns of the spectral band. In contrast, a coating of the type described with reference to FIG. 2 substantially suppresses reflectance, particularly at the 10 micrometer portion, as illustrated by the dashed curve. The spectral performance of the structure, which incorporates a coating of a mixture of magnesium fluoride and silicon dioxide which is co-evaporated over the coverglass, is thus significantly improved.

DESCRIPTION OF ALTERNATE EMBODIMENTS

An alternative embodiment for reducing reflectance and enhancing emissivity of the substrate is shown in FIG. 4. A coverglass or substrate 16 is joined to a solar cell 10 by means of an adhesive 18. The substrate 16, which is made of fused silica for example, has pairs of alternating layers of silicon dioxide 32a-n and magnesium fluoride 34a-n deposited on the fused silica. These layers can be any thickness below 0.03 $\mu$m, with this upper limit determined by the need for these layers to be optically thin in the silicon solar cell response band to eliminate potential reflectance losses due to interface effects. The number of layer pairs is such that the total physical thickness of all pairs combined is about 1.5 $\mu$m. These multiple pairs of very thin layers appear similar to the co-evaporated magnesium fluoride, silicon dioxide layer for radiation near 10 $\mu$m and thus provide an equivalent emissivity enhancement as the homogeneous co-evaporated layer described in the preferred embodiment. A relatively thick antireflectance layer of magnesium fluoride 36 is formed on top of the coating comprising the paired thin films of silicon dioxide and magnesium fluoride.

To derive the desired coatings and thicknesses, the silicon dioxide and magnesium fluoride layers were deposited at about 150° and at base vacuums of $5\times10^{-5}$ to $5\times10^{-6}$ Torr. The nominal thicknesses, about 17.0 nanometers for silicon oxide and about 40.0 nanometers for magnesium fluoride, were achieved by monitoring the deposition rates on a crystal rate monitor.

FIG. 5 provides an indication of the difference between the percent reflectance for a substrate made of uncoated fused silica (solid line) and a structure using the coating disclosed with reference to FIG. 4 (broken line). The structure incorporated 25 pairs or periods of $SiO_2$ of about 17.0 nanometers thickness alternating with $MgF_2$ of about 40.0 nanometers nominal thickness deposited on fused silica. Reflectance is significantly reduced in the region of the reststrahlen peak.

The assembly disclosed herein is not limited to the specific materials, dimensions and parameters set forth above. For example, the substrate may be fabricated from any material, including Corning 0211 glass microsheet or Pilkington CMX ceria doped glass, which would experience suppression of the reststrahlen reflectance of the substrate with resultant enhanced emissivity. Other advantages and features are realized with the novel design of the invention. For example, the disclosed coating configurations afford lowering of operating temperatures of thermal control mirror surfaces of spacecraft. These advantages including power gain are realized without any significant loss in other areas of performance.

What is claimed is:

1. An article for use in enhancing emissivity of a solar cell comprising:
    a substrate having a predetermined reststrahlen band which exhibits a peak of reflectance of substantially over 40%;
    a coating formed as a single layer on said substrate, said single layer comprising at least two materials that are coevaporated in a vacuum chamber in a predetermined ratio so that the reststrahlen reflection of the individual materials is reduced while retaining substantial transparency across the solar spectrum, said layer having a predetermined thickness and serving to reduce the reflectance of the substrate so that it is substantially below 40% reststrahlen band, so that emissivity of said substrate is effectively enhanced.

2. An article as in claim 1, wherein said materials comprise silicon dioxide and magnesium fluoride.

3. An article as in claim 2, wherein said layer contains approximately 60% silicon dioxide and 40% magnesium fluoride.

4. An article as in claim 1, wherein said layer has a transmission characteristic in the visible region of the optical spectrum of about 97%.

5. An article as in claim 1, wherein said substrate is made of fused silica.

6. An assembly as in claim 1, wherein said substrate is made of a specialty glass selected from the group comprising Pilkington CMX glass and Corning 0211 microsheet.

7. An article as in claim 1, wherein said layer has a thickness corresponding to approximately one quarter wave optical thickness at the wavelength of the reststrahlen band of the substrate.

8. An article as in claim 1, including a combination of thin films deposited over said layer, said combination forming an ultraviolet reflector.

9. An article as in claim 8, wherein said combination of thin films comprise alternating layers of tantalum pentoxide and silicon dioxide.

10. An article as in claim 9, wherein each pair of adjacent thin films of tantalum pentoxide and silicon dioxide of said combination is characterized by having a quarterwave optical thickness of about 0.3 micrometers.

11. An article as in claim 8, further including an antireflectance layer disposed over said combination of thin films.

12. An article as in claim 11, wherein said antireflectance layer is made of magnesium fluoride.

13. An article for use with a solar cell comprising:
a substrate having a predetermined reststrahlen band which exhibis a peak of reflectance of substantially over 40%;
a coating formed of a multiplicity of pairs of thin films deposited on said substrate, each pair comprising films of two different materials, said coating serving to reduce the reflectance of the reststrahlen reflectance band exhibited by the substrate to substantially below 40%.

14. An assembly as in claim 13, wherein the thickness of each pair of thin films is less than 0.05 micrometers.

15. An assembly as in claim 13, wherein said thin films of each pair are made of silicon dioxide and magnesium fluoride respectively.

16. An assembly as in claim 13, wherein said substrate is made of fused silica.

17. An assembly as in claim 13, wherein said coating includes a multiplicity of pairs of periods of silicon dioxide and magnesium fluoride disposed on a fused silica substrate, and the nominal thickness of each silicon dioxide film is about 0.017 micrometers and of each magnesium fluoride film about 0.04 micrometers.

18. In a method for enhancing the emissivity of a substrate formed of a material having a predetermined reststrahlen band having a reflectance peak substantially above 40% and having a surface, forming a layer on said surface from a mixture of at least two different materials in a manner so as to reduce the reststrahlen reflection of the materials in the mixture and the reststrahlen band of the substrate so that the reflectance of the reststrahlen band of the substrate is substantially below 40% while retaining substantial transparency across the solar spectrum.

19. A method as in claim 18 wherein the coating is formed to a thickness of approximately 1.5 to 1 micrometers corresponding to approximately one quarter wave optical thickness at the reflectance peak of the reststrahlen band of the substrate.

20. A method as in claim 18 wherein the two different materials are evaporated at substantially different rates.

21. A method as in claim 20 wherein said two different materials are silicon dioxide and magnesium fluoride and wherein the magnesium fluoride is evaporated at a rate which is substantially less than the rate of evaporation for the silicon dioxide.

22. A method as in claim 21 wherein evaporation rates for the silicon dioxide and magnesium fluoride are approximately 60% and 40% respectively.

* * * * *